United States Patent [19]

DeNigris et al.

[11] 4,047,781

[45] Sept. 13, 1977

[54] PRINTED WIRING BOARD HANDLE HAVING VIEWABLE OPTION CONNECTORS

[75] Inventors: Ernest Gerard DeNigris, Colts Neck; Ralph John Palette, Middletown, N.J.

[73] Assignee: Bell Telephone Laboratories, Incorporated, Murray Hill, N.J.

[21] Appl. No.: 701,425

[22] Filed: June 30, 1976

[51] Int. Cl.$^{2}$ .......................... H05K 1/14; H05K 1/18

[52] U.S. Cl. ............................... 339/17 R; 339/32 R; 339/58; 339/113 L; 361/399; 361/415

[58] Field of Search ....................... 339/17, 18, 19, 32, 339/45, 110, 113, 176 M, 176 MP, 217 S, 58; 317/101 CC, 101 CB, 101 DH

[56] References Cited

U.S. PATENT DOCUMENTS

| | | | |
|---|---|---|---|
| 3,176,261 | 3/1965 | Greco et al. | 339/217 S |
| 3,393,449 | 7/1968 | Garcia | 317/101 CC |
| 3,573,558 | 4/1971 | Babcock | 317/101 DH |
| 3,580,985 | 5/1971 | Rothfuss | 339/17 R |
| 3,829,821 | 8/1974 | Derr et al. | 339/176 M |

*Primary Examiner*—Roy Lake
*Assistant Examiner*—Neil Abrams
*Attorney, Agent, or Firm*—David H. Tannenbaum

[57] ABSTRACT

A handle is disclosed for use in conjunction with a key telephone printed wiring board. The handle is constructed having windows along the front surface and electrical contacts grouped behind each window. A multicontact connector is optionally connected to various of the contacts within each group and the group of contacts to which the connector is attached at any given time is easily ascertained by viewing through the associated window. The window, in addition to providing a means for determining the selected options without resorting to the removal of the board from the network, also serves to protect the individual connectors from inadvertent removal.

11 Claims, 4 Drawing Figures

PRINTED WIRING BOARD HANDLE HAVING VIEWABLE OPTION CONNECTORS

FIELD OF THE INVENTION

This invention relates to a handle for use in conjunction with key telephone printed wiring boards.

BACKGROUND OF THE INVENTION

In key telephone systems the line control boards have handles positioned along the edge opposite the terminals for the purpose of providing gripping surfaces for removing the printed wiring board from the network. Typically, the handles are provided with electrical terminals which can be interconnected in various combinations to provide different operational characteristics for the associated line circuit.

Because of the universal nature of the line boards the option connections must be easily changeable. This has been accomplished in the past by using a series of terminals to which wires may be attached and by cross-connecting the wires between the terminals to provide the required circuit parameters. Such an arrangement has the drawback that some degree of skill is involved in changing options. In addition, the wiring terminals are located on the inside of the handle away from the view of the craftsperson and thus, in order to ascertain which options are currently associated with a line board it is necessary to remove the line board from the network.

Thus, it is desired to construct a key telephone circuit board having easily determinable and easily changeable options while at the same time preventing the accidental change of the established options.

SUMMARY OF THE INVENTION

By arranging the electrical terminals of the handle into groups and by further dividing each group of terminals into subgroups it is possible to adapt an electrical connector to simultaneously bridge the terminals of each subgroup. In this manner the various options are achieved by use of an easily removable connector. The handle is constructed with viewing windows each associated with one of the groups of terminals. By observing through the window, while the board is connected to the network, it is easy to determine which subgroup of terminals a connector is bridging. Thus, a craftsperson, merely by observing the various windows on the outer surface of the handle can determine the operational characteristics of the associated line circuit board. Since the actual bridging connector is physically located behind the main body of the handle it cannot be accidentally changed or damaged. However, by removing a line circuit board from the network, and with a knowledge of which terminals must be interconnected, an otherwise untrained person can easily, by moving the option connectors, change the circuit as necessary.

Accordingly, it is a feature of our invention to provide a key telephone line circuit handle having viewing windows spaced along an outer surface of the handle and having positioned behind each window a group of electrical contacts, each group divided into subgroups, so that the subgroup to which a bridging connector is connected is ascertainable by viewing through the window while the line circuit is connected to the network.

It is another feature of our invention to provide a handle for a key telephone line circuit capable of easily controlling the optional characteristics of the line circuit by the interconnections of various electrical contacts, the interconnection being made by a bridging connector the position of which is visible from the front of the line circuit when the line circuit is connected to the network.

It is still another feature of our invention to provide a key telephone line circuit handle having option contacts bridgable by an electrical connector and having windows through which it may be ascertained the precise contacts which are bridged at any time through which the circuit state may be ascertained by reference to a visual indicator.

BRIEF DESCRIPTION OF THE DRAWING

The principles of our invention as well as additional features and advantages thereof will be more fully appreciated from the illustrative embodiment shown in the drawing, in which.

DETAILED DESCRIPTION

Figure 1:
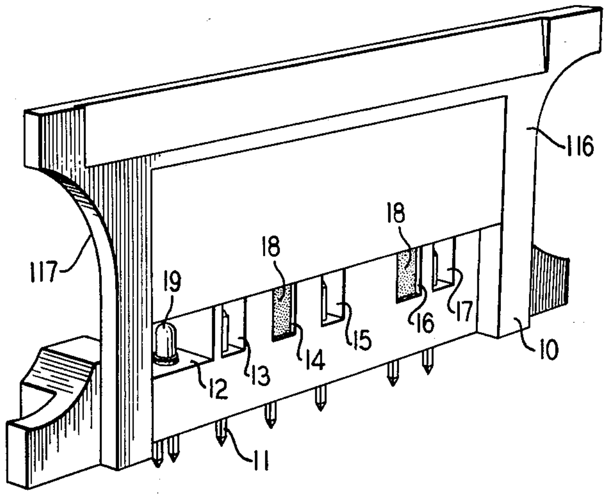
FIG. 1 shows a front outside view of our line circuit handle.

As shown in FIG. 1 handle 10 is arranged for mounting on a printed wiring board at the front edge thereof. The handle has outer surface 16 and inner surface 17 and a plurality of windows 12, 13, 14, 15, 16, 17. Each window has associated therewith a number of contacts 11 divided into subgroups. One end of each contact is arranged to extend into or through the associated printed wiring board for electrical contact with the circuitry thereof. These contacts may be made fast, by solder or other conventional means, to the board to hold the handle rigid, or additional contacts or other fasteners or bonding systems can be used for this purpose. The other end of each contact is adapted to receive in mating relationship a multicontact connector, such as connector 18 shown in more detail in FIG. 3. When the connector is in contact with the contacts 11 it is visible through the window associated with those contacts.

Figure 2:
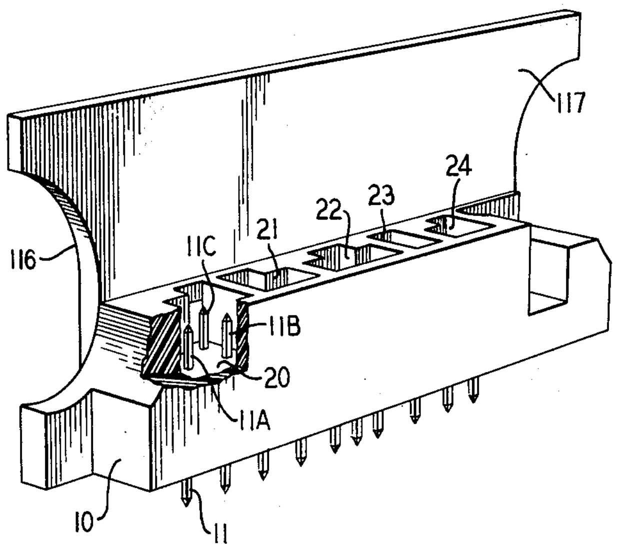
FIG. 2 shows a rear inside view.
Figure 3:
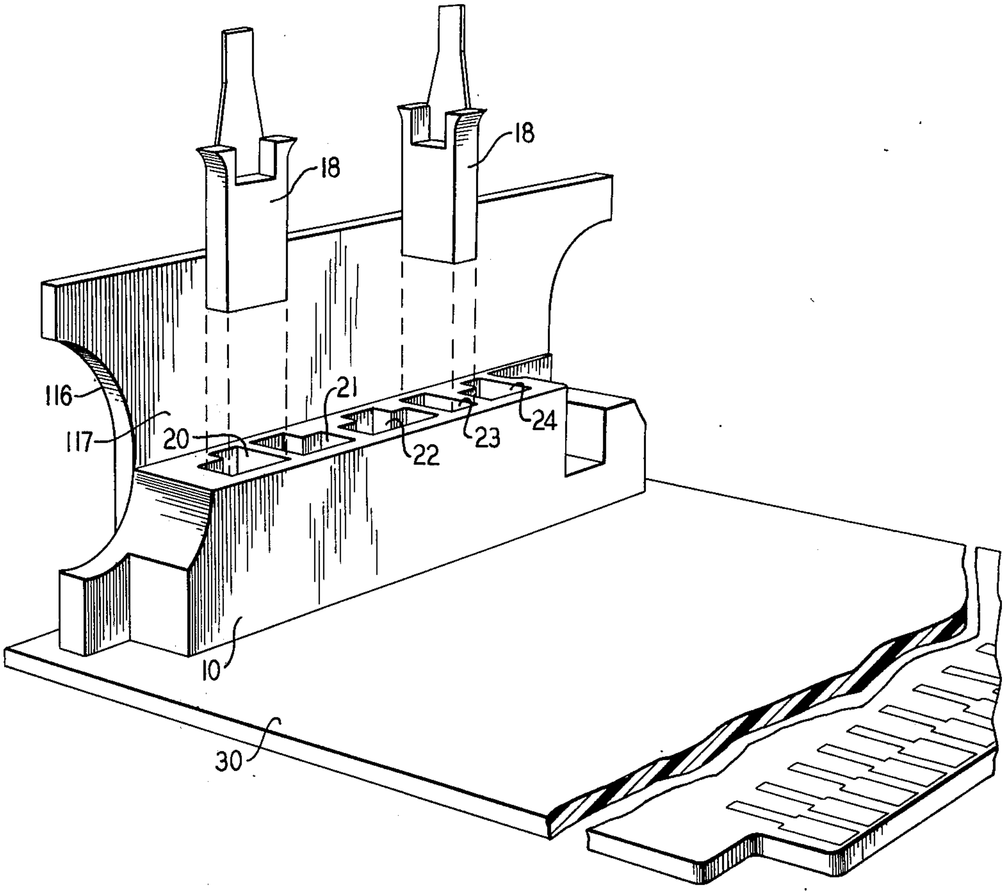
FIG. 3 shows the handle with option connectors mounted to a line circuit board.

In FIG. 2 the inside view of handle 10 shows the division of contacts 11 into groups, each group located within a particular one of the areas 20, 21, 22, 23 or 24. Each group of contacts is further broken into subgroups, such that, with respect to area 20, contacts 11A and 11B form one subgroup while contacts 11B and 11C form a second subgroup. Connector 18, shown in more detail in FIG. 3, is arranged with two mating contacts such that it can be inserted over the first subgroup, in which case contacts 11A and 11B become electrically common; or it can be inserted over the second subgroup, in which case contacts 11B and 11C become electrically common.

This same situation holds true for each of the areas and as many connectors 18 as are necessary can be used, one for each group of contacts. As shown in FIG. 1, if the connector is associated with the rearmost subgroup of contacts in any one area, the view through the window associated with that area would easily reveal that fact since the unconnected contact would easily be visible, with connector 18 in the background. This is the situation with windows 13, 15 and 17. On the other hand, if the connector were associated with the front contact only, the connector would be visible in the window as is the case with windows 14 and 16.

Figure 4:
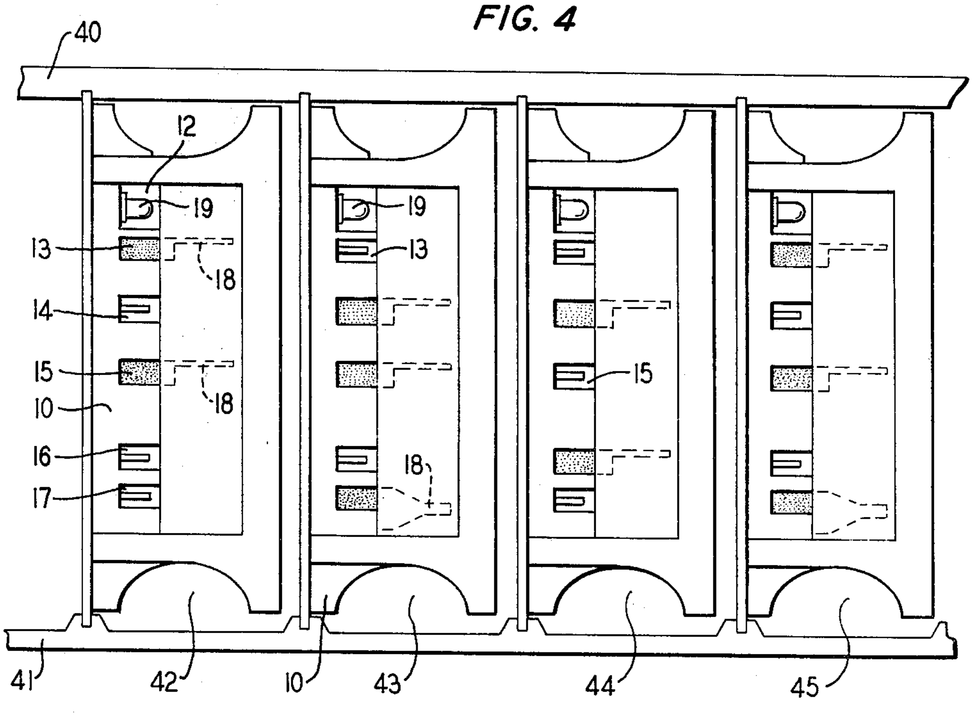
FIG. 4 shows a group of line circuit boards connected into a system with only the front outside surfaces visible.

As shown in FIG. 1, window 12 has a light emitting diode therein for the purpose of visually identifying the electrical state of the line circuit. Also, as shown in FIG. 1 connectors 18, while easily visible through the respective windows, cannot easily be removed or inadvertently damaged by contact with the front surface of the handle while the handle is inserted into the network. Thus, as shown in FIG. 4, many such handles, each attached to the edge of a printed wiring board as illustrated in FIG. 3, are lined up one next to the other being held in place by slides 40 and 41. The craftsperson, merely by observing the windows along the outer front surface of each handle can determine which option has been selected for each associated board. Thus, as shown in FIG. 4, handle 10 in position 42 has the following options: window 13, front subgroup; window 14, rear subgroup; window 15, front subgroup; windows 16 and 17, rear subgroups. Handle 10 in position 43 has the following options: window 13, rear subgroup; windows 14 and 15, front subgroup; window 16, rear subgroup; window 17, front subgroup.

The craftsperson, by knowledge of a standard option code layout, can thus easily determine the circuit operation of each line card without removing the card board from the network and without making written notations on the face of the line card.

CONCLUSION

While the invention is shown in reference to a key telephone line card one skilled in the art can easily adapt the arrangement described to any line card which is edge connected to an electrical circuit and wherein it is desired to have easily identifiable and easily changeable options. Also, it is within the skill of the art to arrange each window with more than two options and to arrange the bridging option connector having more than two contacts and with certain color codes for different arrangements.

What is claimed is:

1. A handle for attachment along a side edge of a printed wiring circuit board, said handle comprising:

outer and inner surfaces, separated by a central portion, said central portion including upper and lower surfaces, a plurality of electrical contacts disposed within said central portion, and extending through said lower surface for attachment to said side edge of said circuit board, each of said electrical contacts arranged for mating relationship with one contact of a multicontact connector, and said electrical contacts arranged into groups, a plurality of windows in said outer surface of said handle, each said group uniquely associated with one of said groups of contacts, said contacts being arranged into subgroups within each said group in a manner allowing a single multicontact connector to become connected optionally and exclusively to any selected one of said subgroups, one contact within each group being common to at least two subgroups, each said window being positioned with respect to said associated group of contacts in a manner which allows a visual determination to be made through said window as to which one of said subgroups of contacts of said associated group of contacts a multiconnector is connected.

2. The invention set forth in claim 1 wherein said window is further positioned to inhibit the removal of any connected associated connector.

3. The invention set forth in claim 2 wherein said multicontact connector has two electrically common contacts.

4. The invention set forth in claim 3 wherein said electrical contacts of said handle are arranged for electrical connection with the printed wiring of an attached printed wiring board.

5. The invention set forth in claim 4 wherein said electrical connection includes means for rigidly positioning said handle with respect to said circuit board.

6. The invention set forth in claim 5 wherein one of said windows is adapted to provide light signals indicative of the circuit state of an attached printed wiring board.

7. A key telephone line circuit board having edge contacts for connecting said circuit board into an electrical network and having a handle mounted opposite said edge contacts, said line circuit having several optional circuit states, said handle comprising a plurality of electrical contacts disposed along said handle, each said contact having one end thereof connected to said circuit board and the other end thereof arranged for mating relationship with the bridged contacts of a multicontact removable connector, said contacts arranged into groups and into subgroups within each such group, one contact within each group being common to at least two subgroups, said multicontact connector being selectively connectable to only one of said subgroup of contacts at any one time to define one of said optional circuit states, a plurality of windows defined in a front surface of said handle, said front surface being visible when said circuit board is inserted into said electrical network, each said window uniquely associated with one of said groups of contacts and arranged with respect to said associated contact group in a manner which allows a visual determination to be made through said window as to which one of said subgroups of contacts of said associated group of contacts said multicontact connector is connected.

8. The invention set forth in claim 7 wherein said window is further positioned to inhibit the removal of any connected associated connector.

9. The invention set forth in claim 8 wherein said electrical contacts of said handle are arranged for electrical connection with the printed wiring of an attached printed wiring board.

10. The invention set forth in claim 9 wherein said electrical connection includes means for rigidly positioning said handle with respect to said circuit board.

11. The invention set forth in claim 10 wherein one of said windows is adapted to provide light signals indicative of the circuit state of an attached printed wiring board.

* * * * *